(12) United States Patent
Wang et al.

(10) Patent No.: US 10,170,539 B2
(45) Date of Patent: *Jan. 1, 2019

(54) STACKED CAPACITOR WITH ENHANCED CAPACITANCE

(71) Applicant: TAIWAN SEMICONDUCTOR MANUFACTURING COMPANY LTD, Hsinchu (TW)

(72) Inventors: Szu-Yu Wang, Hsinchu (TW); Yeur-Luen Tu, Taichung (TW); Chih-Yu Lai, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/861,435

(22) Filed: Jan. 3, 2018

(65) Prior Publication Data

US 2018/0145128 A1    May 24, 2018

Related U.S. Application Data

(63) Continuation of application No. 15/072,936, filed on Mar. 17, 2016, now Pat. No. 9,871,095.

(51) Int. Cl.
*H01L 49/02* (2006.01)
*H01L 23/522* (2006.01)

(52) U.S. Cl.
CPC .......... *H01L 28/60* (2013.01); *H01L 23/5223* (2013.01); *H01L 23/5226* (2013.01)

(58) Field of Classification Search
CPC .......... H01L 28/55; H01L 28/87; H01L 28/88; H01L 28/86; H01L 23/5223; H01L 28/60; H01L 23/5226
See application file for complete search history.

(56) References Cited

U.S. PATENT DOCUMENTS 9,871,095 B2 *    1/2018    Wang ................ H01L 28/60

* cited by examiner

*Primary Examiner* — Andrew Q Tran
(74) *Attorney, Agent, or Firm* — WPAT, P.C., Intellectual Property Attorneys; Anthony King

(57) ABSTRACT

A semiconductor device is provided. The semiconductor device includes a semiconductor substrate, a stacked structure and contact vias. The stacked structure includes a plurality of conductive layers, and two adjacent conductive layers are isolated from each other with at least one dielectric layer. The contact vias have different heights, and partially through the stacked structure. Each of the plurality of contact vias is electrically connected to a corresponding conductive layer.

20 Claims, 20 Drawing Sheets

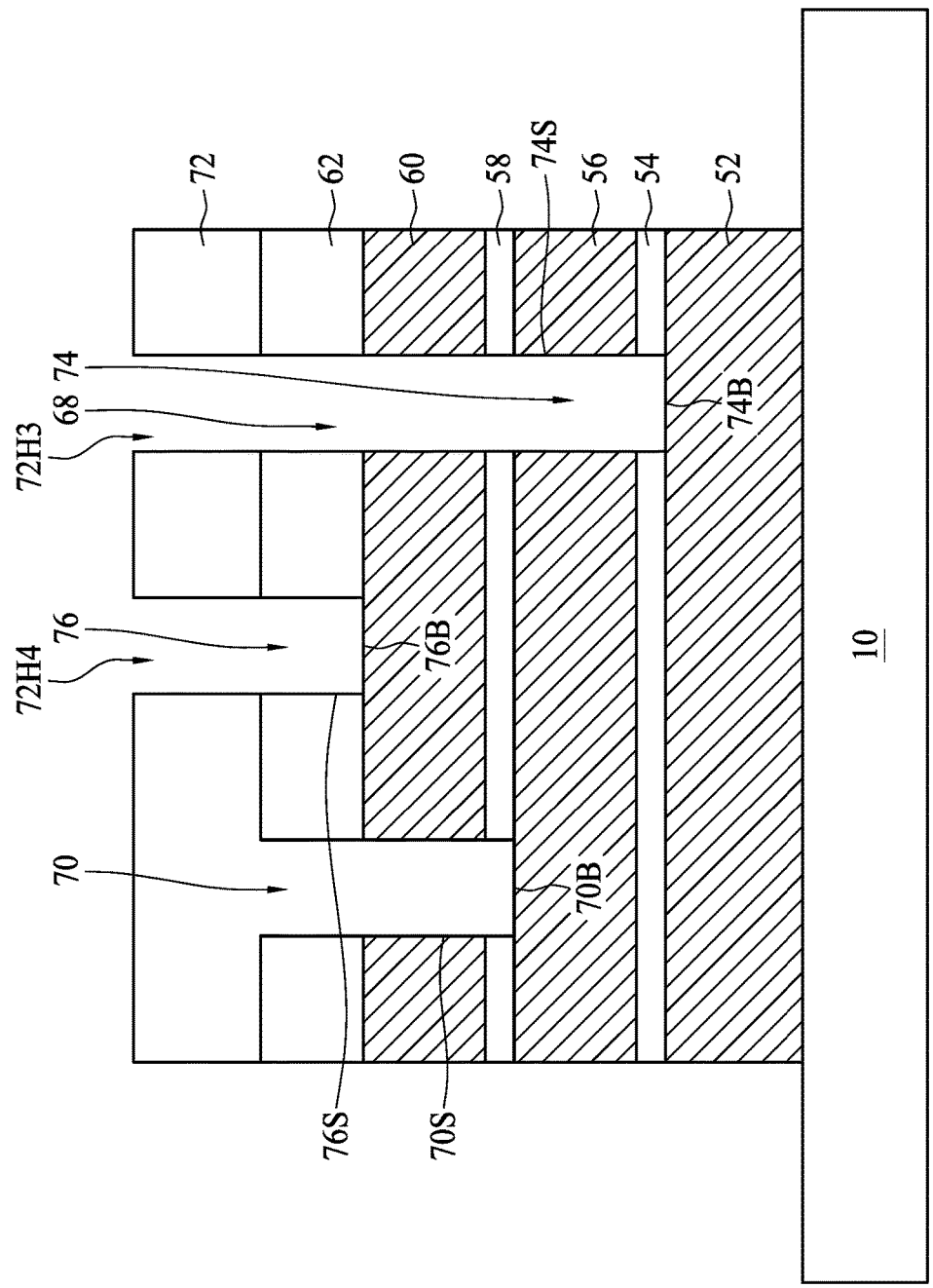

STACKED CAPACITOR WITH ENHANCED CAPACITANCE

CROSS REFERENCE TO RELATED APPLICATIONS

This application is a continuation of application Ser. No. 15/072,936, filed on Mar. 17, 2016, now allowed, which is incorporated by reference in its entirety.

BACKGROUND

Capacitive structures are used as electronic elements in integrated circuits such as Logic devices, CMOS image sensors (CIS), radio frequency integrated circuits (RFIC), monolithic microwave integrated circuits (MMIC), and etc. Capacitive structures include, for example, metal-oxide-semiconductor (MOS) capacitors, p-n junction capacitors and metal-insulator-metal (MIM) capacitors. For some applications, MIM capacitors can provide certain advantages over MOS and p-n junction capacitors because the frequency characteristics of MOS and p-n junction capacitors may be restricted as a result of depletion layers that form in the semiconductor electrodes. An MIM capacitor can exhibit improved frequency and temperature characteristics.

An MIM capacitor includes a dielectric layer disposed between lower and upper electrode plates. The desired capacitance density is usually increased with increased integrated circuit density in dimension scaling. The capacitance density, however, may not be simply increased by stacking more electrode plates due to the area loss resulted from contact vias for electrically connecting each of the electrode plates.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIGS. 4A, 4B, 4C, 4D, 4E, 4F, 4G and 4H are cross-sectional views at one of various operations of manufacturing a semiconductor device according to some embodiments of the present disclosure.

DETAILED DESCRIPTION

Figure 1:
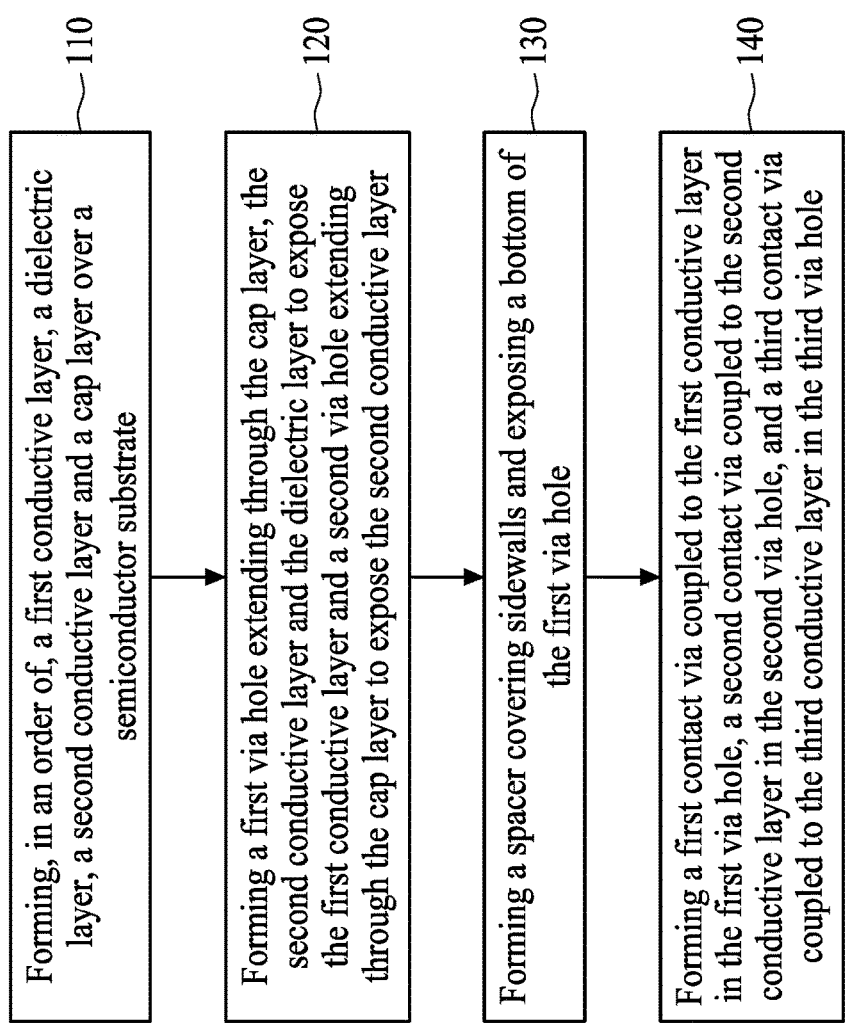
FIG. 1 is a flow diagram illustrating a method for forming a stacked capacitor according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first" and "second" describe various elements, components, regions, layers and/or sections, these elements, components, regions, layers and/or sections should not be limited by these terms. These terms may be only used to distinguish one element, component, region, layer or section from another. The terms such as "first" and "second" when used herein do not imply a sequence or order unless clearly indicated by the context.

In some embodiments of the present disclosure, a stacked capacitor including a plurality of electrode plates stacked in a vertical direction is provided. The stacked capacitor includes a plurality of contact vias (also referred to as contact plugs) electrically connected to the respective electrode plates. The contact via electrically connected to a lower plate is extended through an upper plate through a via hole. Compared with the area of the electrode plate, the area of the contact via is extremely minute. Accordingly, the area of the upper plate is substantially identical to the area of the lower plate. Consequently, the capacitance density of the stacked capacitor is enhanced. In some embodiments, the stacked capacitor is an MIM (metal-insulator-metal) capacitor including a plurality of metal plates stacked in the vertical direction with capacitor dielectric layer(s) interposed therebetween.

In the present disclosure, the stacked capacitor can be used as electronic elements in integrated circuits such as Logic devices, CMOS image sensors (CIS), radio frequency integrated circuits (RFIC), monolithic microwave integrated circuits (MMIC) and any integrated circuits with high density capacitance requirement.

FIG. 1 is a flow diagram illustrating a method for forming a stacked capacitor according to some embodiments of the present disclosure. The method 100 begins with operation 110, in which a first conductive layer, a dielectric layer, a second conductive layer and a cap layer are formed in order over a semiconductor substrate. The method 100 proceeds with operation 120, in which a first via hole extending through the cap layer, the second conductive layer and the dielectric layer is formed to expose the first conductive layer, and a second via hole extending through the cap layer is formed to expose the second conductive layer. The method 100 continues with operation 130 in which, a spacer covering sidewalls and exposing a bottom of the first via hole is formed. The method 100 proceeds with operation 140, in which a first contact via coupled to the first conductive layer in the first via hole, a second contact via coupled to the second conductive layer in the second via hole, and a third contact via coupled to the third conductive layer in the third via hole are formed.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
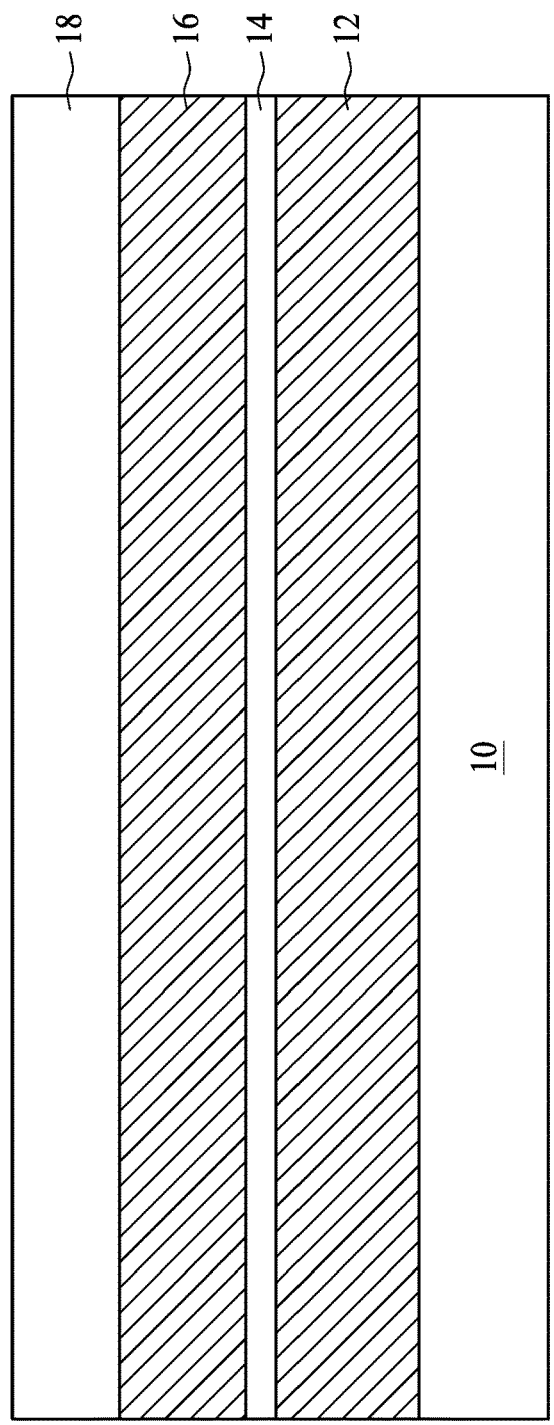
FIGS. 2A, 2B, 2C, 2D, 2E, 2F and 2G are cross-sectional views at one of various operations of manufacturing a semiconductor device according to some embodiments of the present disclosure.
Figure 2B:
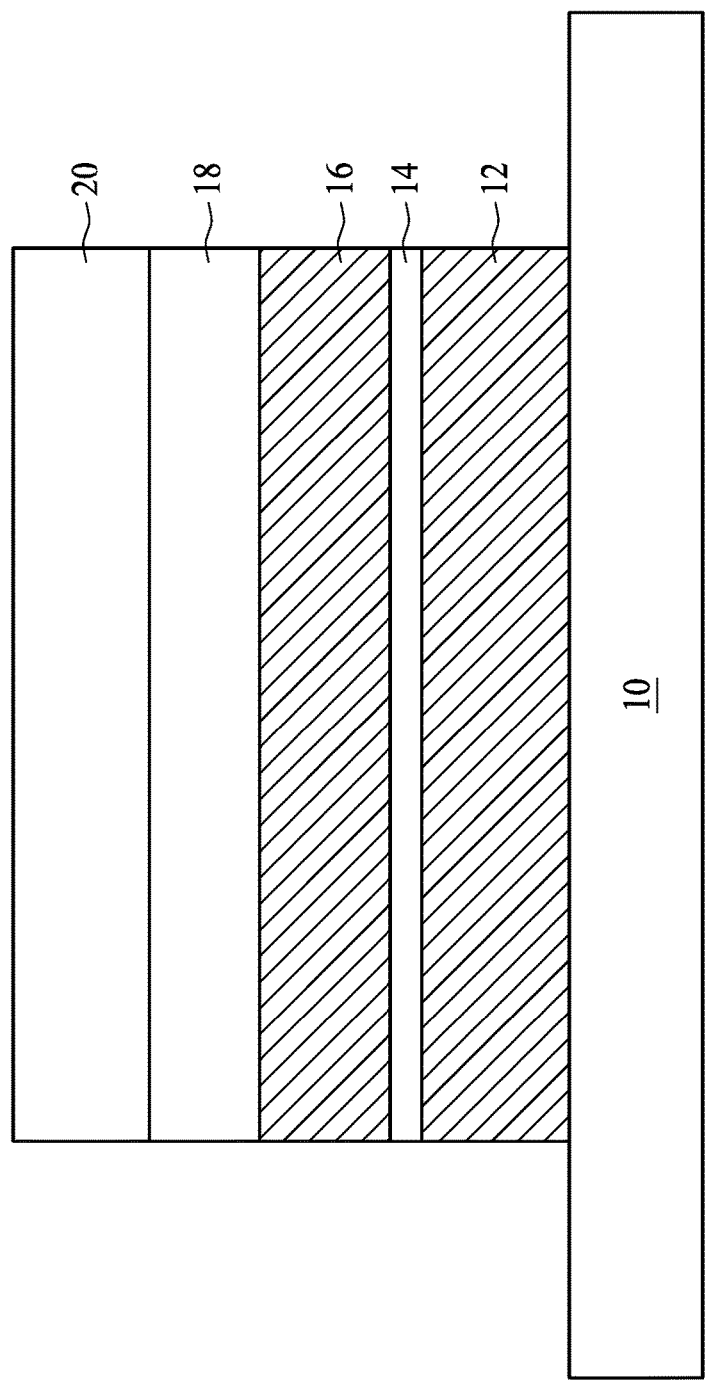
Figure 2C:
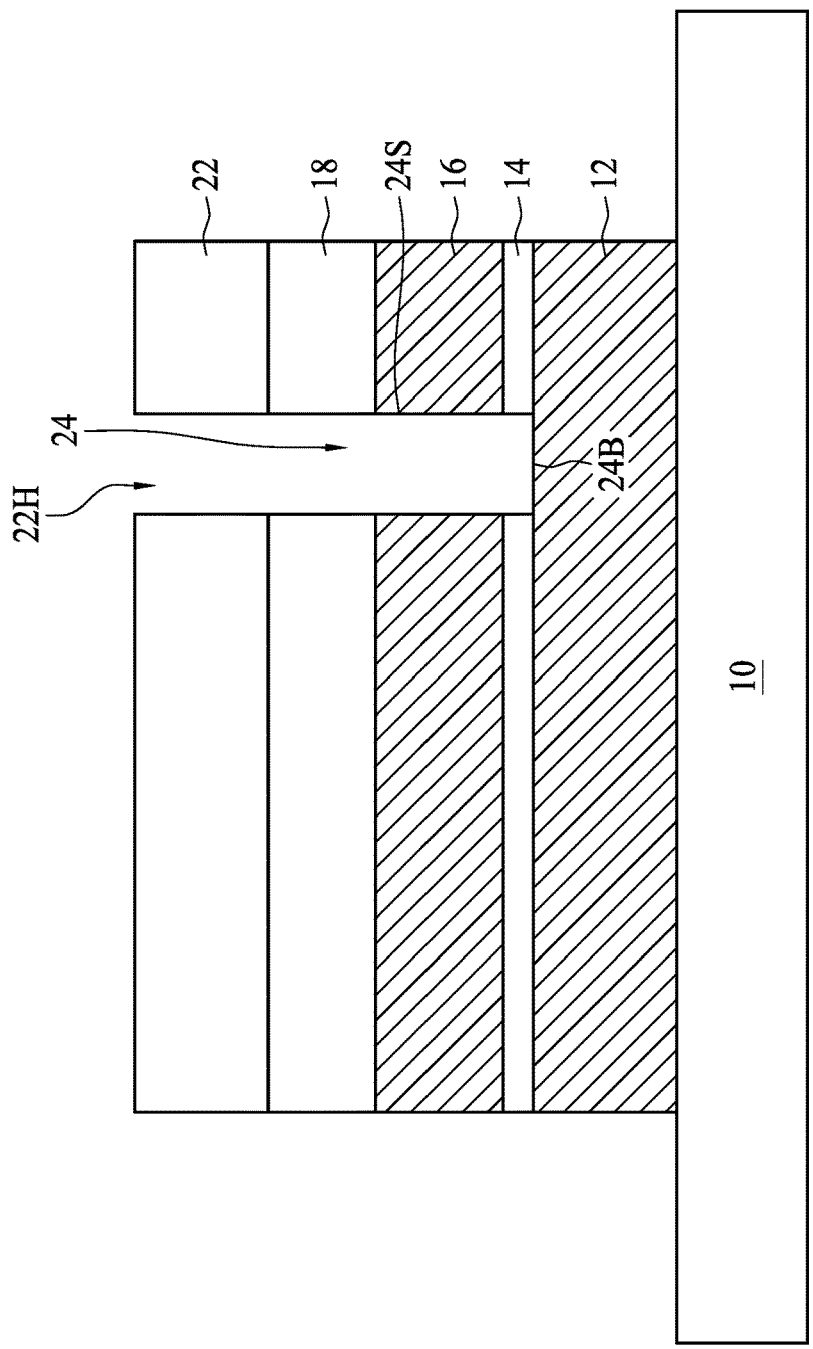
Figure 2D:
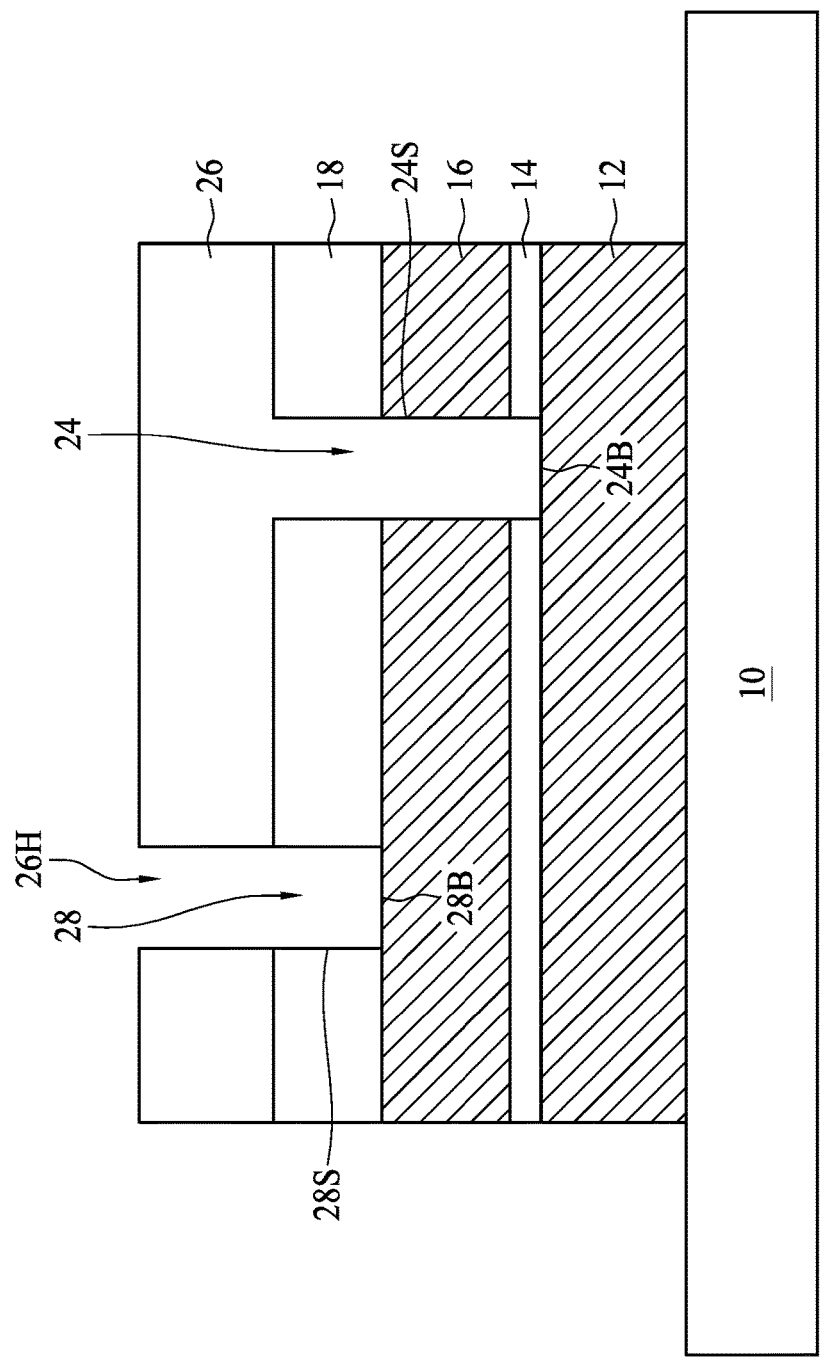
Figure 2E:
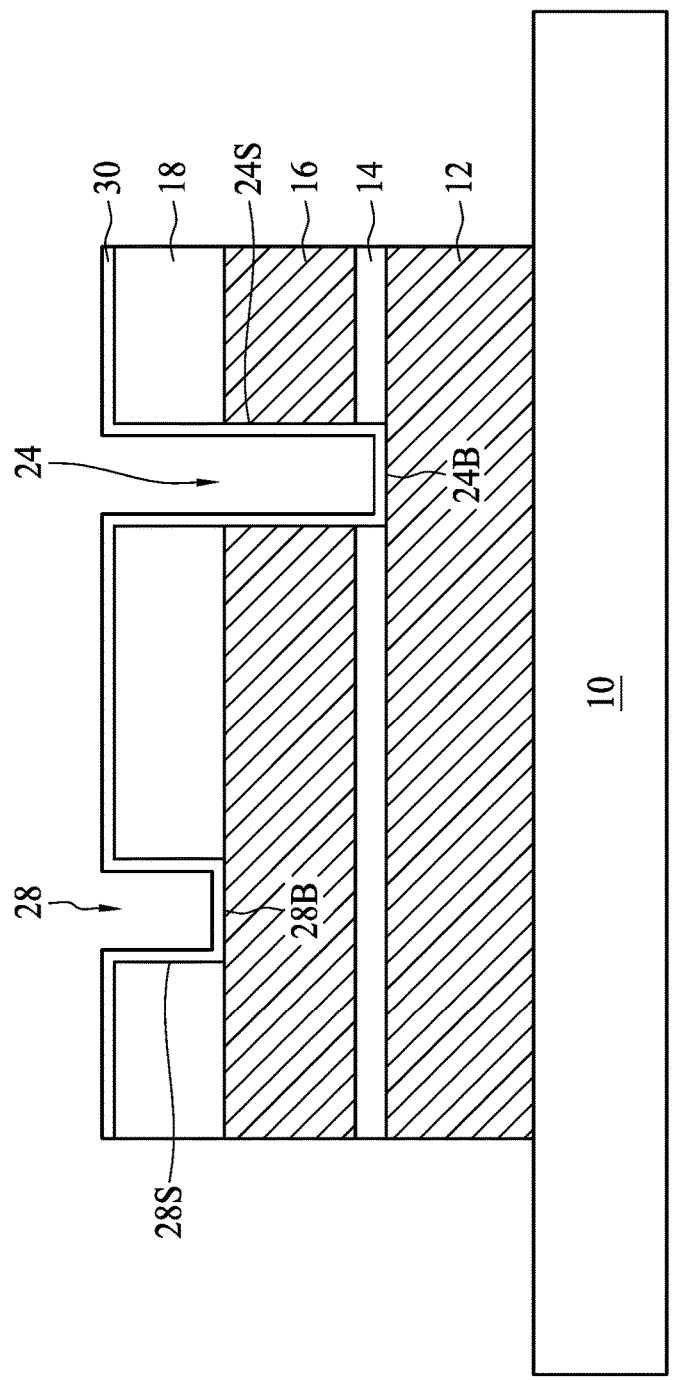
Figure 2F:
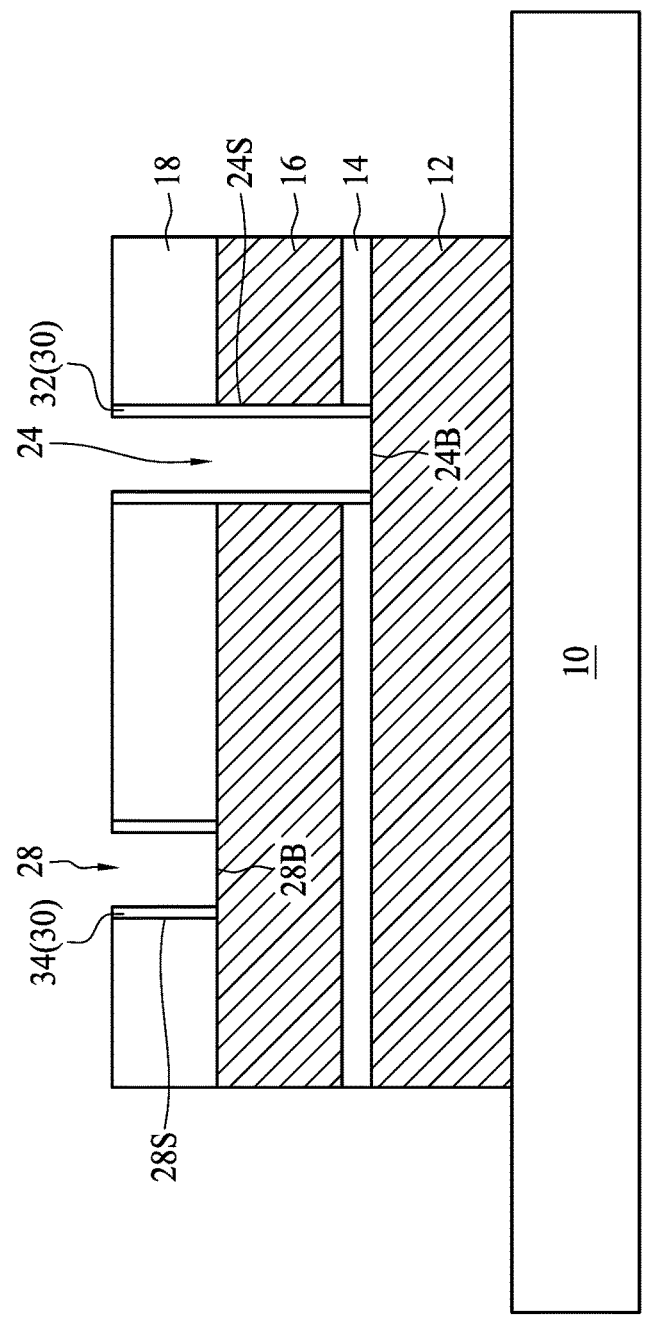
Figure 2G:
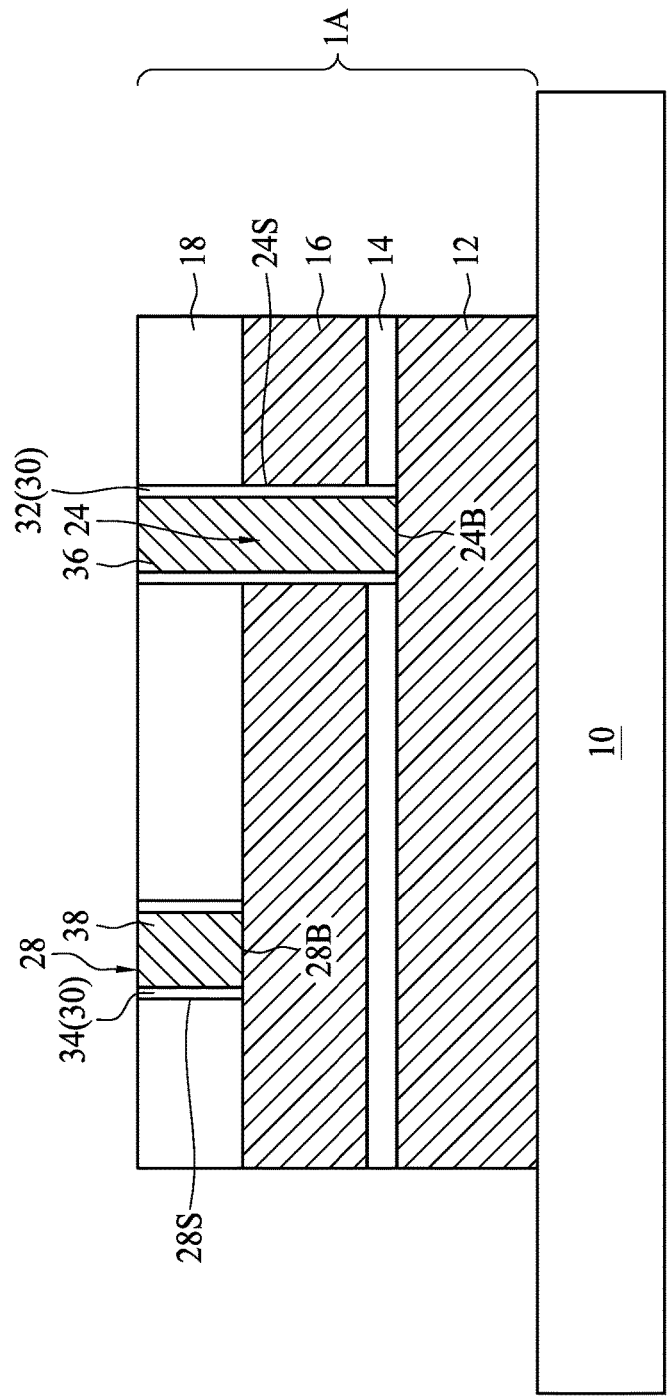
Figure 2H:
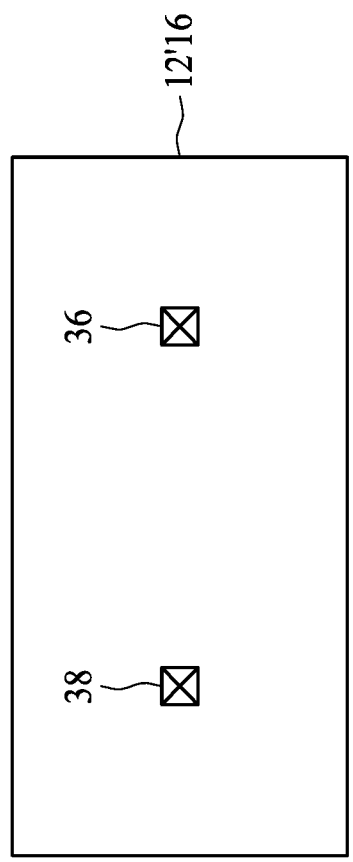
FIG. 2H is a top view of a semiconductor device according to some embodiments of the present disclosure.

FIGS. 2A, 2B, 2C, 2D, 2E, 2F and 2G are cross-sectional views at one of various operations of manufacturing a semiconductor device according to some embodiments of the present disclosure, and FIG. 2H is a top view of a semiconductor device according to some embodiments of the present disclosure. As depicted in FIG. 2A and operation 110 in FIG. 1, the method 100 begins at operation 110 in which a first conductive layer 12, a dielectric layer 14, a second conductive layer 16 and a cap layer 18 are formed over a semiconductor substrate 10. In some embodiments, the semiconductor substrate 10 includes a bulk semiconductor substrate. The bulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the substrate includes a multilayered substrate, such as a silicon-on-insulator (SOI) substrate, which includes a bottom semiconductor layer, a buried oxide layer (BOX) and a top semiconductor layer. In still some embodiments, the substrate includes an insulative substrate, such as a glass substrate, a conductive substrate, or any other suitable substrates.

In some embodiments, the material of the first conductive layer 12 includes metal such as copper (Cu), aluminum (Al), tungsten (W), or other suitable metal or alloy. In some embodiments, the material of the first conductive layer 12 includes metal compound such as titanium nitride (TiN), tantalum nitride (TaN), or other suitable metal compounds. The first conductive layer 12 may be single-layered or multi-layered structure. The first conductive layer 12 may be formed over the semiconductor substrate 10 by physical vapor deposition (PVD), chemical vapor deposition (CVD) or any other suitable operations.

In some embodiments, the material of the dielectric layer 14 may include high-k dielectric material (i.e., a dielectric material having a dielectric constant greater than silicon dioxide). In some embodiments, the material of the dielectric layer 14 may include low-k dielectric material (i.e., a dielectric material having a dielectric constant equal to or less than silicon dioxide). By way of examples, the material of the dielectric layer 14 includes silicon dioxide ($SiO_2$), silicon nitride ($Si_3N_4$), aluminum oxide ($Al_2O_3$), tantalum oxide ($Ta_2O_5$), titanium oxide ($TiO_2$), zirconium oxide ($ZrO_2$), hafnium oxide ($HfO_2$), lanthanum oxide ($La_2O_3$), strontium titanate ($SrTiO_3$) or any other suitable low-k or high-k dielectric materials. The dielectric layer 14 may be formed over the first conductive layer 12 by atomic layer deposition (ALD), chemical vapor deposition (CVD) or any other suitable operations.

In some embodiment, the second conductive layer 16 includes metal such as copper (Cu), aluminum (Al), tungsten (W), or other suitable metal or alloy. In some embodiments, the material of the second conductive layer 16 includes metal compound such as titanium nitride (TiN), tantalum nitride (TaN), or other suitable metal compounds. The second conductive layer 16 may be single-layered or multi-layered structure. The second conductive layer 16 may be formed over the dielectric layer 14 by PVD, CVD or any other suitable operations.

In some embodiments, the material of the cap layer 18 may include dielectric material such as silicon dioxide, silicon nitride, silicon oxynitride, undoped silicon glass (USG) or any other suitable high-k or low-k dielectric materials. The cap layer 18 may be a single-layered structure or multi-layered structure. The cap layer 18 may be formed over the second conductive layer 16 by CVD, ALD or any other suitable operations.

As depicted in FIG. 2B, the cap layer 18, the second conductive layer 16, the dielectric layer 14 and the first conductive layer 12 are patterned. In some embodiments, a resist layer 20 such as a photoresist layer is formed over the cap layer 18. Then, the cap layer 18, the second conductive layer 16, the dielectric layer 14 and the first conductive layer 12 exposed by the resist layer 20 are removed by dry etching. In some embodiments, the patterned first conductive layer 12 is configured as a lower electrode plate of an MIM capacitor, and the patterned dielectric layer 14 is configured as a capacitor dielectric layer, and the patterned second conductive layer 16 is configured as an upper electrode plate. The lower electrode plate and the upper electrode plate of the MIM capacitor are patterned in the same patterning operation, and thus have substantially the same area. The resist layer 20 is subsequently removed.

As depicted in operation 120 of FIG. 1, a first via hole extending through the cap layer, the second conductive layer and the dielectric layer is formed to expose the first conductive layer, and a second via hole extending through the cap layer is formed to expose the second conductive layer. In some embodiments, the first via hole and the second via hole are, but not limited to be, formed by the following operations. As depicted in FIG. 2C, another resist layer 22 such as a photoresist layer is formed over the cap layer 18. The resist layer 22 has an opening 22H exposing a portion of the cap layer 18. Then, the cap layer 18, the second conductive layer 16 and the dielectric layer 14 are etched through the opening 22H of the resist layer 22 to form a first contact via 24 partially exposing the first conductive layer 12. In some embodiments, the sidewall 24S of the first via hole 24 is substantially vertical. In some embodiments, the sidewall 24S of the first via hole 24 is substantially inclined outwardly. The resist layer 22 is subsequently removed.

As depicted in FIG. 2D, another resist layer 26 such as a photoresist layer is formed over the cap layer 18. The resist layer 26 has an opening 26H exposing another portion of the cap layer 18. Then, the cap layer 18 is etched through the opening 26H of the resist layer 22 to form a second contact via 28 partially exposing the second conductive layer 16. In some embodiments, the sidewall 28S of the second via hole 28 is substantially vertical. In some embodiments, the sidewall 28S of the second via hole 28 is substantially inclined outwardly. Subsequently, the resist layer 26 is removed.

As depicted in operation 130, a spacer covering sidewalls and exposing a bottom of the first via hole is formed. In some embodiments, the spacer is, but not limited to be, formed by the following operations. As depicted in FIG. 2E, an insulative layer 30 is formed on the cap layer 18, a bottom 24B and sidewalls 24S of the first via hole 24, and on a bottom 28B and sidewalls 28S of the second via hole 28. The material of the insulative layer 30 may include silicon dioxide, silicon nitride, or any other suitable insulative materials. The insulative layer 30 covers the bottom 24B and the sidewalls 24S of the first via hole 24, and the bottom 28B and the sidewalls 28S of the second via hole 28, but does not fill up the first via hole 24 and the second via hole 28. In some embodiments, the insulative layer 30 is substantially conformal to the bottom 24B and the sidewalls 24S of the first via hole 24, and the bottom 28B and the sidewalls 28S of the second via hole 28. The insulative layer 30 may be formed by atomic layer deposition (ALD) so that the insulative layer 30 has good step coverage. In some embodiments, the insulative layer 30 is formed by CVD, PVD or any other suitable operations.

As depicted in FIG. 2F, the insulative layer 30 on the bottom 24B of the first via hole 24 is etched to form a first spacer 32 exposing the first conductive layer 12, and the insulative layer 30 on the bottom 28B of the second via hole 28 is etched to form a second spacer 34 exposing the second conductive layer 16. In some embodiments, an anisotropic etching such as a dry etching without a mask layer is performed to remove the insulative layer 30 on the bottom 24B of the first via hole 24 and the bottom 28B of the second via hole 28, while the insulative layer 30 on the sidewalls 24S and the sidewall 28S is preserved. The first spacer 32 is configured as isolation between the second conductive layer 16 and the first contact via to be formed.

As depicted in FIG. 2G-2H and in operation 140 of FIG. 1, a first contact via 36 coupled to the first conductive layer (lower electrode plate) 12 is formed in the first via hole 24, and a second contact via 38 coupled to the second conductive layer (upper electrode plate) 16 is formed in the second via hole 28. In some embodiments, the first contact via 36 and the second contact via 38 are formed by forming a conductive layer (not shown) over the cap layer 18 and in the first via hole 24 and the second via hole 28. The conductive layer over the cap layer 18 is then removed by, for example, etching or chemical mechanical polishing (CMP). The material of the first contact via 36 and the second contact via 38 may include tungsten (W), copper (Cu), aluminum (Al), or any other suitable conductive materials. Accordingly, a semiconductor device 1 having a dual-layered stacked capacitor 1A is accomplished.

The first contact via 36 is extended through the cap layer 18, the second conductive layer 16 and the dielectric layer 14 to electrically connect the first conductive layer (lower electrode plate) 12 through the first contact via 24. The first spacer 32 is configured to isolate the first contact via 36 from the second conductive layer 16. The perimeter of first contact via 36 is surrounded by the cap layer 18, the second conductive layer 16 and the dielectric layer 14. In such a case, the area of the second conductive layer (upper electrode plate) 16 can be substantially identical to the area of the first conductive layer (lower electrode plate) 12. Accordingly, only the area of the first contact via 36 is sacrificed, and the thus the capacitance density can be enhanced.

Figure 3:
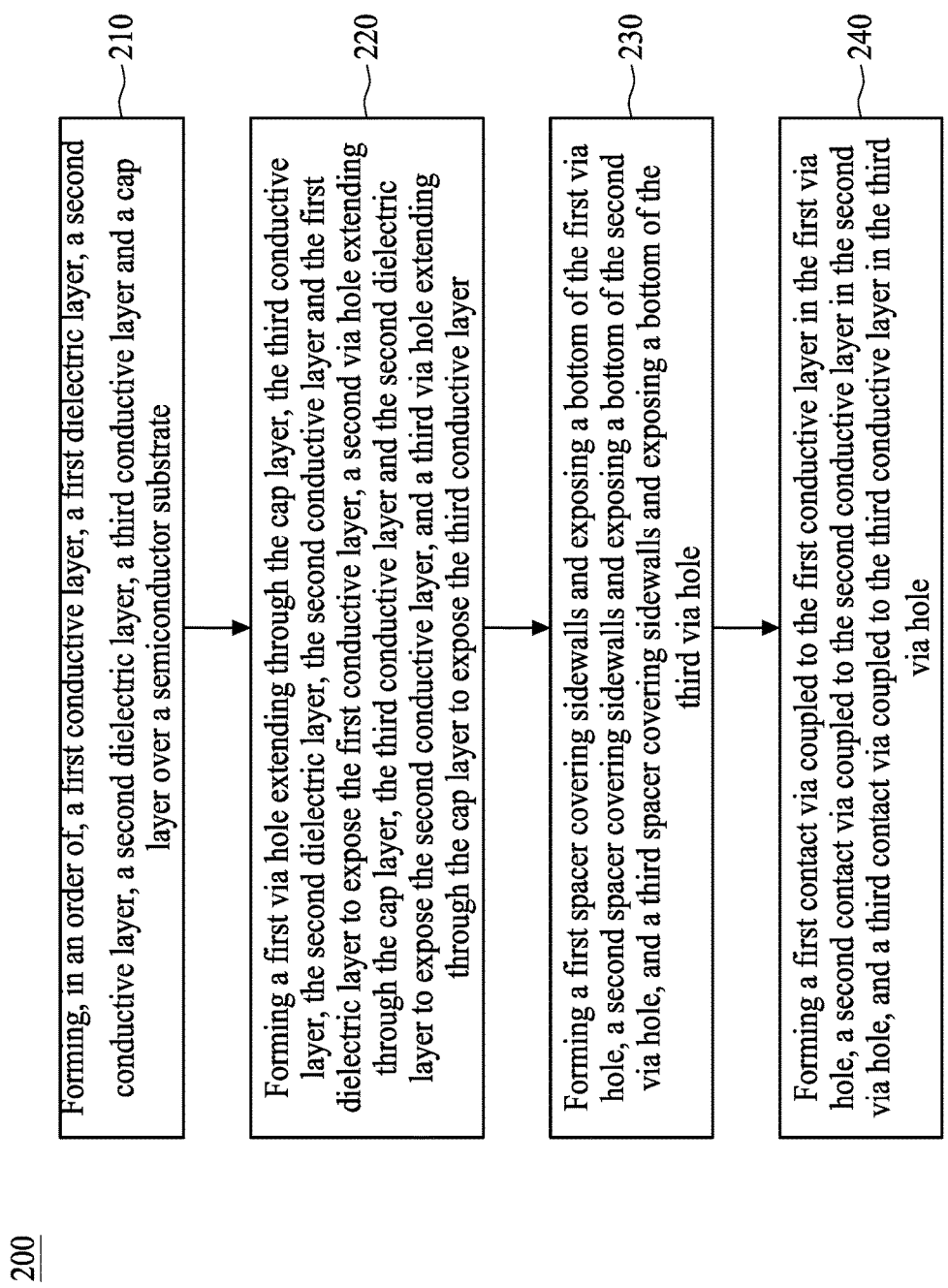
FIG. 3 is a flow diagram illustrating a method for forming a stacked capacitor according to some embodiments of the present disclosure.

FIG. 3 is a flow diagram illustrating a method for forming a stacked capacitor according to some embodiments of the present disclosure. The method 200 begins with operation 210, in which a first conductive layer, a first dielectric layer, a second conductive layer, a second dielectric layer, a third conductive layer and a cap layer are formed in order over a semiconductor substrate. The method 200 proceeds with operation 220, in which a first via hole extending through the cap layer, the third conductive layer, the second dielectric layer, the second conductive layer and the first dielectric layer is formed to expose the first conductive layer, a second via hole extending through the cap layer, the third conductive layer and the second dielectric layer is formed to expose the second conductive layer, and a third via hole extending through the cap layer is formed to expose the third conductive layer. The method 200 continues with operation 230 in which, a first spacer covering sidewalls and exposing a bottom of the first via hole, a second spacer covering sidewalls and exposing a bottom of the second via hole, and a third spacer covering sidewalls and exposing a bottom of the third via hole are formed. The method 200 proceeds with operation 240, in which a first contact via coupled to the first conductive layer is formed in the first via hole, a second contact via coupled to the second conductive layer is formed in the second via hole, and a third contact via coupled to the third conductive layer is formed in the third via hole.

The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method.

Figure 4A:
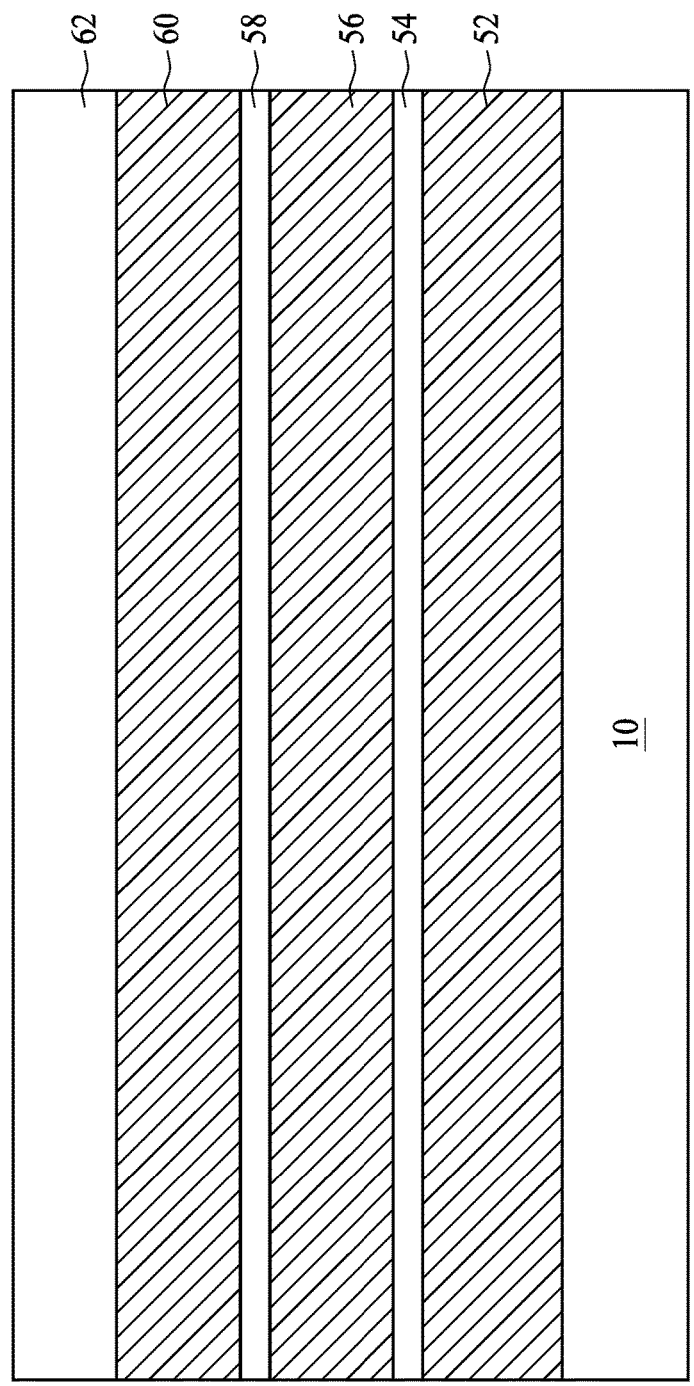
Figure 4B:
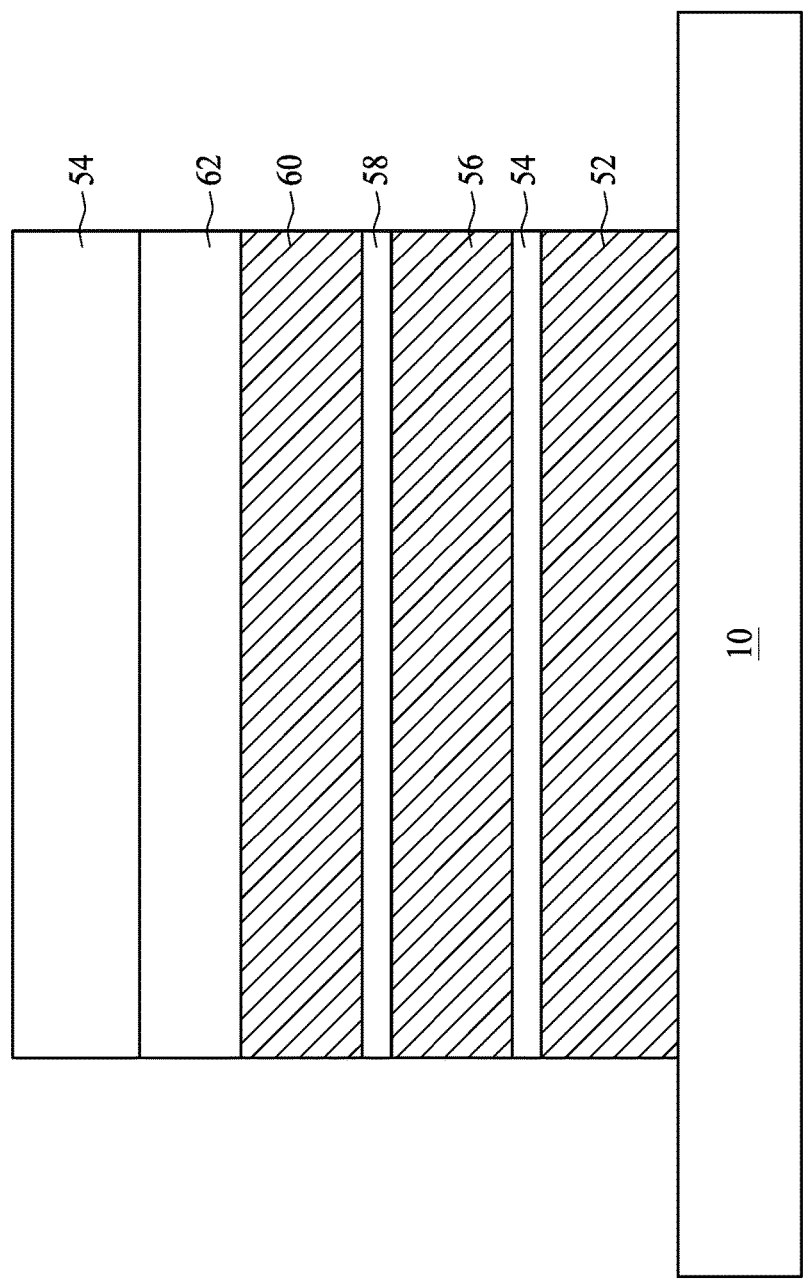
Figure 4C:
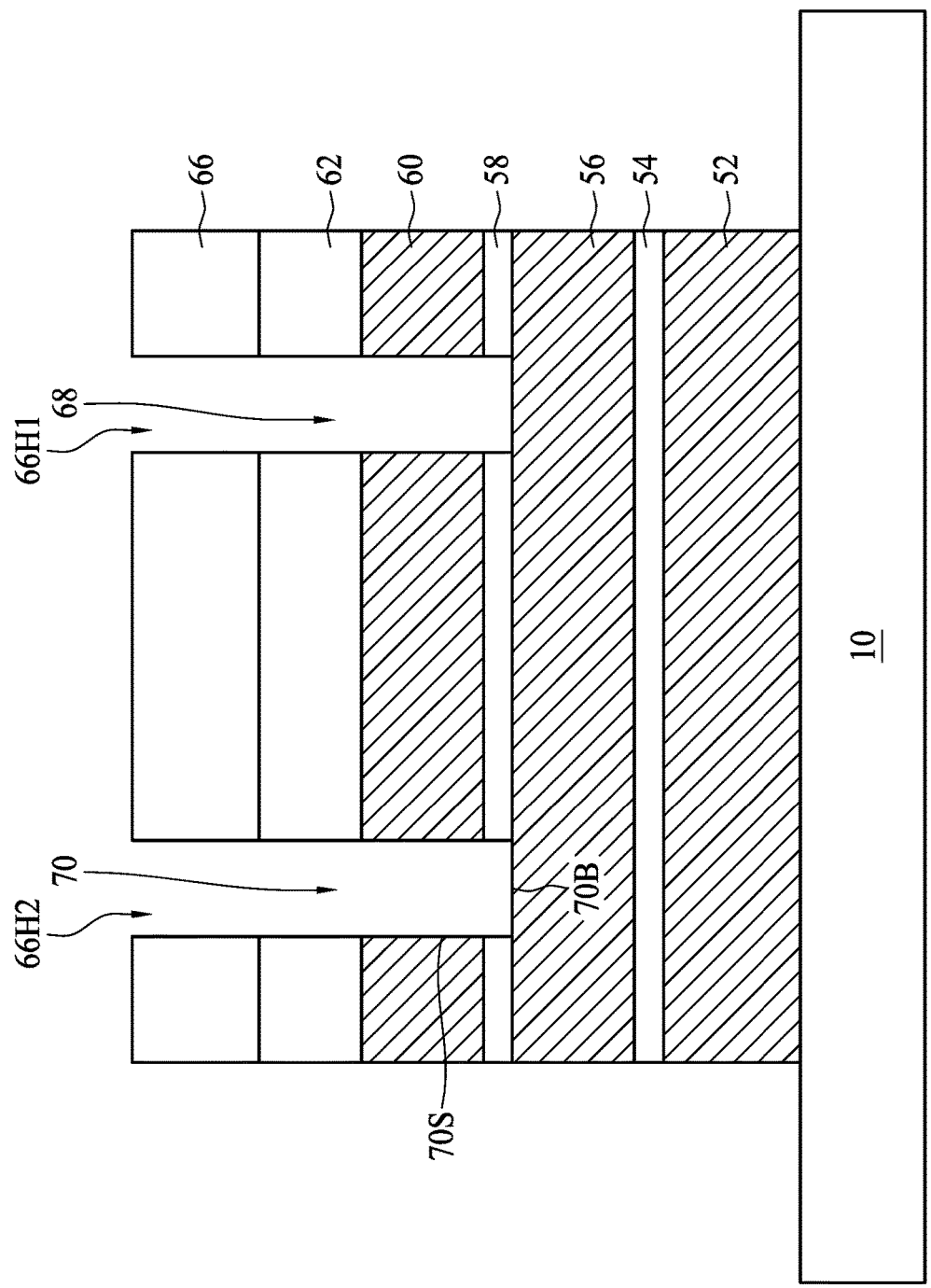
Figure 4D:
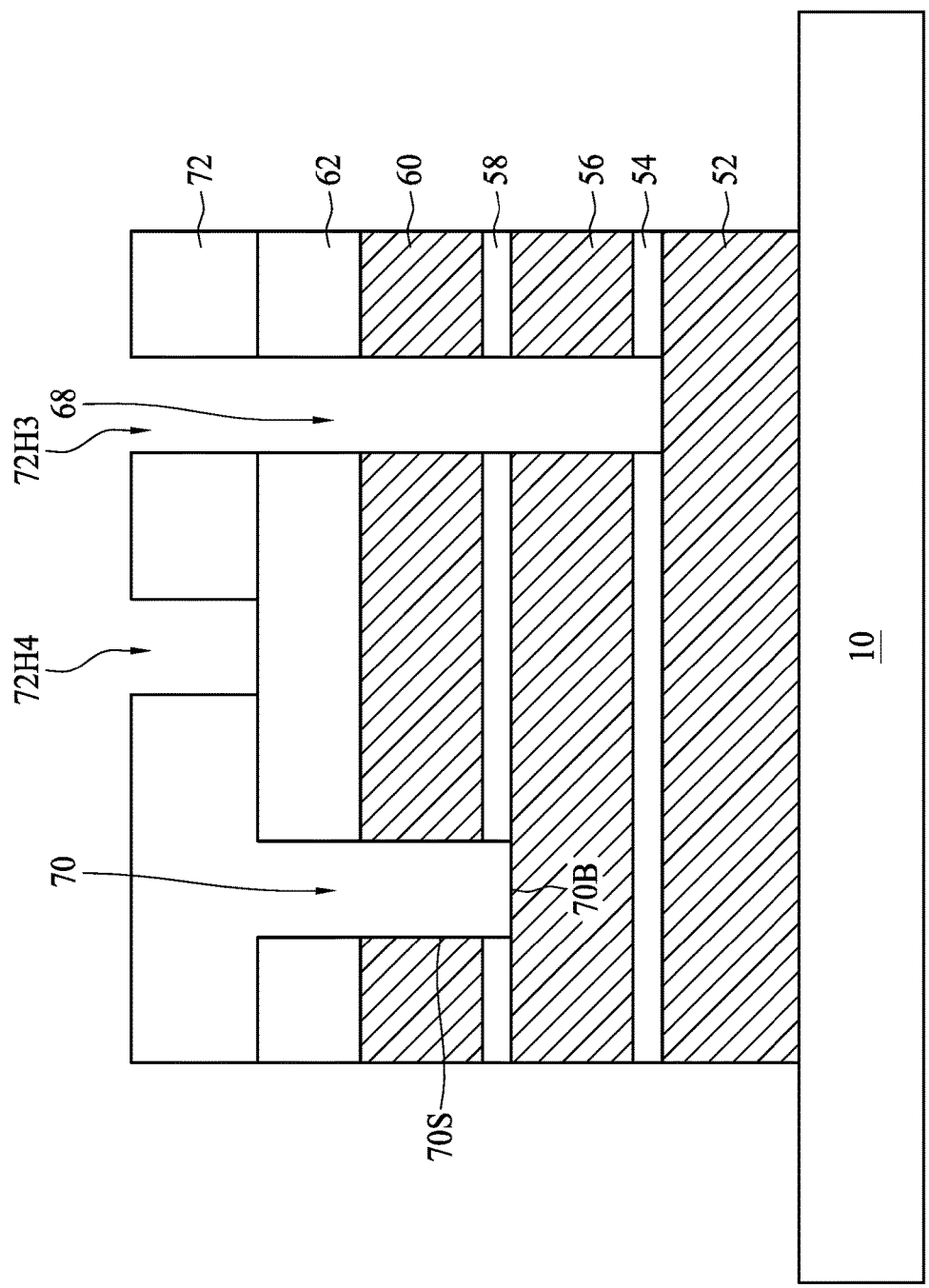
Figure 4F:
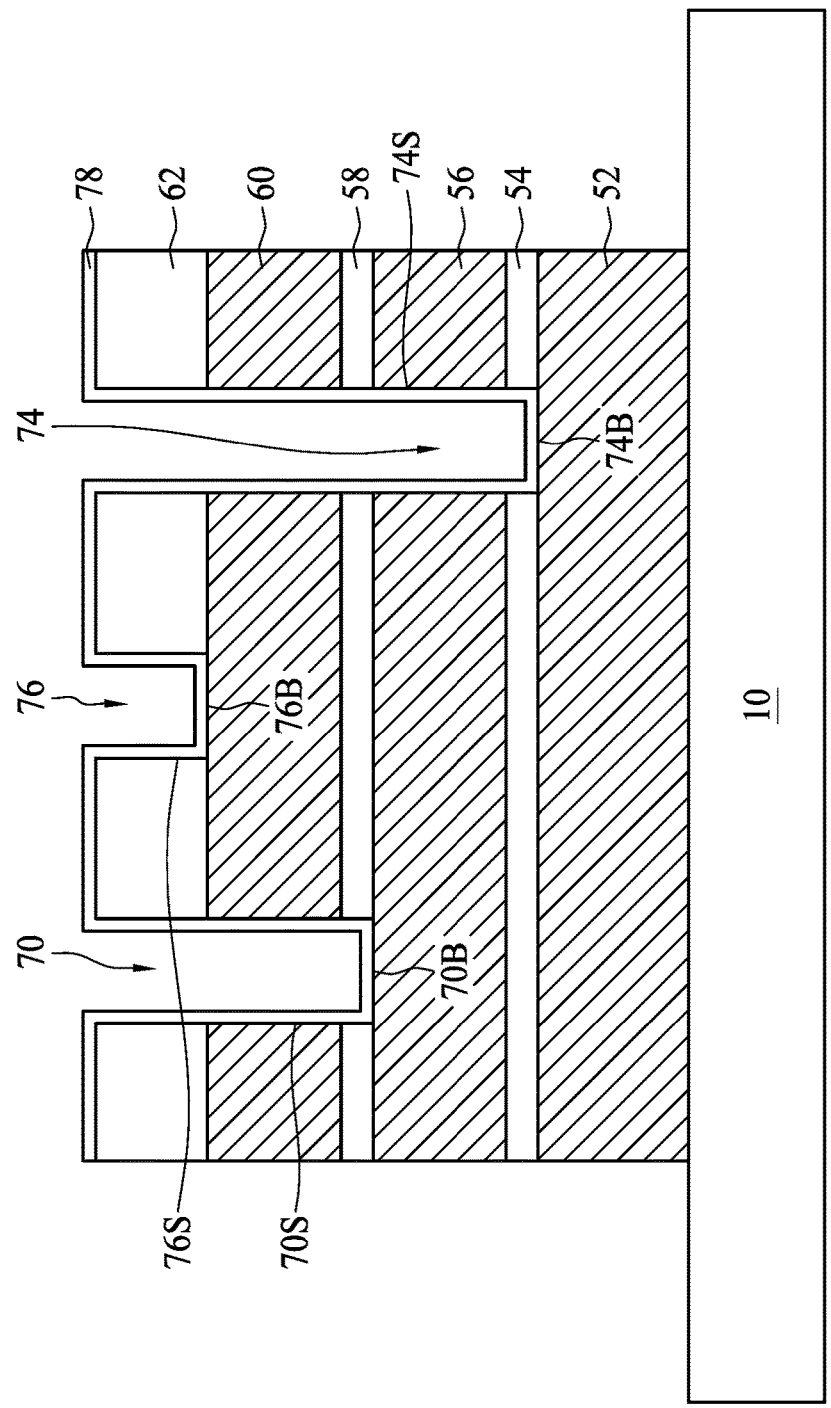
Figure 4G:
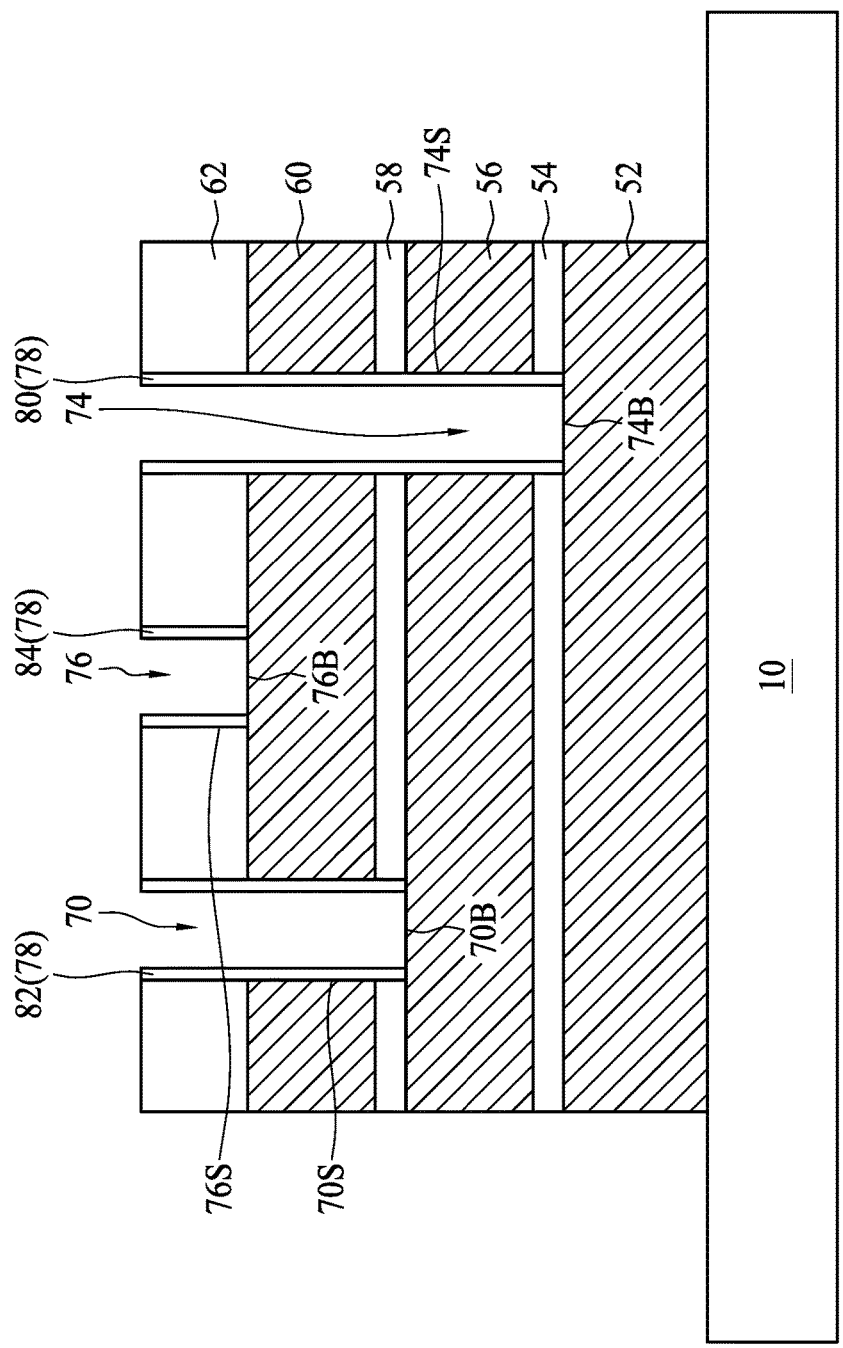
Figure 4H:
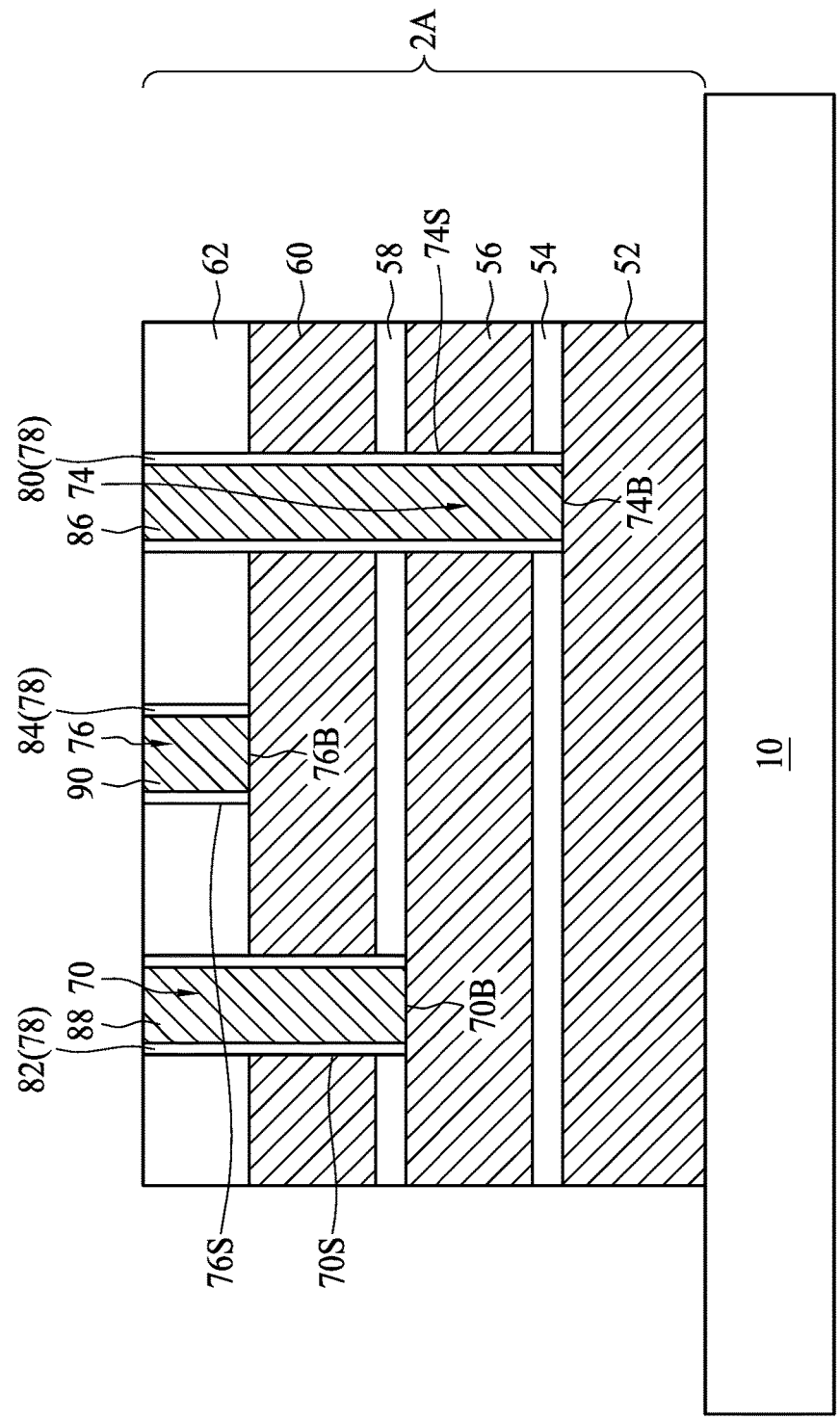
Figure 4I:
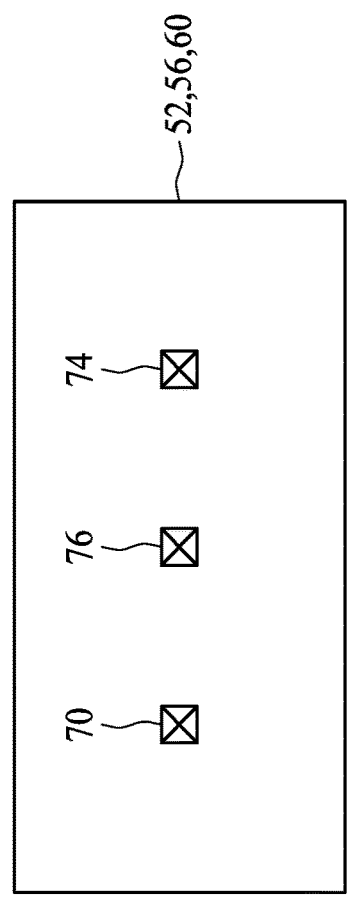
FIG. 4I is a top view of a semiconductor device according to some embodiments of the present disclosure.

FIGS. 4A, 4B, 4C, 4D, 4E, 4F, 4G and 4H are cross-sectional views at one of various operations of manufacturing a semiconductor device according to some embodiments of the present disclosure, and FIG. 4I is a top view of a semiconductor device according to some embodiments of the present disclosure. As depicted in FIG. 4A and operation 210 in FIG. 3, the method 200 begins at operation 210 in which a first conductive layer 52, a first dielectric layer 54, a second conductive layer 56, a second dielectric layer 58, a third conductive layer 60 and a cap layer 62 are formed in order over a semiconductor substrate 10.

In some embodiments, the material of the first conductive layer 52 includes metal such as copper (Cu), aluminum (Al), tungsten (W), or other suitable metal or alloy. In some embodiments, the material of the first conductive layer 52 includes metal compound such as titanium nitride (TiN), tantalum nitride (TaN), or other suitable metal compounds. The first conductive layer 52 may be single-layered or multi-layered structure. The first conductive layer 52 may be formed over the semiconductor substrate 10 by physical vapor deposition (PVD), chemical vapor deposition (CVD) or any other suitable operations.

In some embodiments, the material of the first dielectric layer 54 may include high-k dielectric material (i.e., a dielectric material having a dielectric constant greater than silicon dioxide). In some embodiments, the material of the first dielectric layer 54 may include low-k dielectric material (i.e., a dielectric material having a dielectric constant equal to or less than silicon dioxide). By way of examples, the material of the first dielectric layer 54 includes silicon dioxide ($SiO_2$), silicon nitride ($Si_3N_4$), aluminum oxide ($Al_2O_3$), tantalum oxide ($Ta_2O_5$), titanium oxide ($TiO_2$), zirconium oxide ($ZrO_2$), hafnium oxide ($HfO_2$), lanthanum oxide ($La_2O_3$), strontium titanate ($SrTiO_3$) or any other suitable low-k or high-k dielectric materials. The first dielectric layer 54 may be formed over the first conductive layer 52 by atomic layer deposition (ALD), chemical vapor deposition (CVD) or any other suitable operations.

In some embodiment, the second conductive layer 56 includes metal such as copper (Cu), aluminum (Al), tungsten (W), or other suitable metal or alloy. In some embodiments, the material of the second conductive layer 56 includes metal compound such as titanium nitride (TiN), tantalum nitride (TaN), or other suitable metal compounds. The second conductive layer 56 may be single-layered or multilayered structure. The second conductive layer 56 may be formed over the first dielectric layer 54 by PVD, CVD or any other suitable operations.

In some embodiments, the material of the second dielectric layer 58 may include high-k dielectric material (i.e., a dielectric material having a dielectric constant greater than silicon dioxide). In some embodiments, the material of the second dielectric layer 58 may include low-k dielectric material (i.e., a dielectric material having a dielectric constant equal to or less than silicon dioxide). By way of examples, the material of the second dielectric layer 58 includes silicon dioxide ($SiO_2$), silicon nitride ($Si_3N_4$), aluminum oxide ($Al_2O_3$), tantalum oxide ($Ta_2O_5$), titanium oxide ($TiO_2$), zirconium oxide ($ZrO_2$), hafnium oxide ($HfO_2$), lanthanum oxide ($La_2O_3$), strontium titanate ($SrTiO_3$) or any other suitable low-k or high-k dielectric materials. The second dielectric layer 58 may be formed over the second conductive layer 56 by ALD, CVD or any other suitable operations.

In some embodiment, the third conductive layer 60 includes metal such as copper (Cu), aluminum (Al), tungsten (W), or other suitable metal or alloy. In some embodiments, the material of the third conductive layer 60 includes metal compound such as titanium nitride (TiN), tantalum nitride (TaN), or other suitable metal compounds. The third conductive layer 60 may be single-layered or multi-layered structure. The third conductive layer 60 may be formed over the second dielectric layer 58 by PVD, CVD or any other suitable operations.

In some embodiments, the material of the cap layer 62 may include dielectric material such as silicon dioxide, silicon nitride, silicon oxynitride, undoped silicon glass (USG) or any other suitable high-k or low-k dielectric materials. The cap layer 62 may be a single-layered structure or multi-layered structure. The cap layer 62 may be formed over the third conductive layer 60 by CVD, ALD or any other suitable operations. In some embodiments, the material of the cap layer 62 may be the same as the first dielectric layer 54 or the second dielectric layer 58. In some embodiments, the etching rate of the cap layer 62 is distinct from the etching rate of the first conductive layer 52, the second conductive layer 56 and the third conductive layer 60. Also, the etching rate of the first dielectric layer 54 or the second dielectric layer 58 is distinct from the etching rate of the first conductive layer 52, the second conductive layer 56 and the third conductive layer 60. In some embodiments, the etching selectivity of the cap layer 62 is identical to or similar to the etching selectivity of the first dielectric layer 54 or the second dielectric layer 58.

As depicted in FIG. 4B, the cap layer 62, the third conductive layer 60, the second dielectric layer 58, the second conductive layer 56, the first dielectric layer 54 and the first conductive layer 52 are patterned. In some embodiments, a resist layer 64 such as a photoresist layer is formed over the cap layer 62. Then, the cap layer 62, the third conductive layer 60, the second dielectric layer 58, the second conductive layer 56, the first dielectric layer 54 and the first conductive layer 52 exposed by the resist layer 64 are removed by dry etching. The patterned first conductive layer 52 is configured as a lower electrode plate of an MIM capacitor, the patterned second conductive layer 56 is configured as an intermediate electrode plate, the patterned third conductive layer 60 is configured as an upper electrode plate, and the patterned first dielectric layer 54 and second dielectric layer 58 are configured as capacitor dielectric layers. The lower electrode plate, the intermediate electrode plate and the upper electrode plate of the MIM capacitor are patterned in the same patterning operation, and thus have substantially the same area. The resist layer 64 is subsequently removed.

As depicted in operation 220 of FIG. 3, a first via hole extending through the cap layer, the third conductive layer, the second dielectric layer, the second conductive layer and the first dielectric layer is formed to expose the first conductive layer, a second via hole extending through the cap layer, the third conductive layer and the second dielectric layer is formed to expose the second conductive layer, and a third via hole extending through the cap layer is formed to expose the third conductive layer. In some embodiments, the first via hole, the second hole and the third via hole are, but not limited to, formed by the following operations of FIGS. 4C-4E. As depicted in FIG. 4C, a first resist layer 66 such as a photoresist layer is formed over the cap layer 62. The first resist layer 66 has a first opening 66H1 and a second opening 66H2 partially exposing the cap layer 62. Then, the cap layer 62, the third conductive layer 60, the second dielectric layer 58 are etched through the first opening 66H1 of the first resist layer 66 to form a recess 68 partially exposing the second conductive layer 56, and etched through the second opening 66H2 of the first resist layer 66 to form a second contact via 70 partially exposing the second conductive layer 56. The first resist layer 66 is subsequently removed.

As depicted in FIG. 4D, a second resist layer 72 such as a photoresist layer is formed over the cap layer 62. The second resist layer 72 blocks the second via hole 70. The second resist layer 72 has a third opening 72H3 corresponding to the recess 68 and a fourth opening 72H4 partially exposing the cap layer 62. Then, the second conductive layer 56 is etched through the third opening 72H3 and the recess 68. In some embodiments, the second conductive layer 56 is removed by dry etching with a higher etching rate than the cap layer 62 and the first dielectric layer 54, and the etching rate of the cap layer 62 and the first dielectric layer 54 are identical or similar. Accordingly, the cap layer 52 is nearly not etched during the etching of the second conductive layer 56. Consequently, the etching of the second conductive layer 56 can be controlled to stop at the first dielectric layer 54 and the cap layer 62.

As depicted in FIG. 4E, another dry etching operation is performed to etch the first dielectric layer 54 through third opening 72H3 and the recess 68 to form a first via hole 74 exposing the first conductive layer 52, and to etch the cap layer 62 through the fourth opening 72H4 to form a third via hole 76 exposing the third conductive layer 60. Then, the second resist layer 72 is removed As depicted in operation 230 of FIG. 3, a first spacer covering sidewalls and exposing a bottom of the first via hole, a second spacer covering sidewalls and exposing a bottom of the second via hole, and a third spacer covering sidewalls and exposing a bottom of the third via hole are formed. In some embodiments, the first spacer, the second spacer and the third spacer are, but not limited to, formed by the following operations of FIGS. 4F and 4G. As shown in FIG. 4F, an insulative layer 78 is formed on the cap layer 52, a bottom 74B and sidewalls 74S of the first via hole 74, on a bottom 70B and sidewalls 70S of the second via hole 70, and on a bottom 76B and sidewalls 76S of the third via hole 76. The material of the insulative layer 78 may include silicon dioxide, silicon nitride, or any other suitable insulative materials. The insulative layer 78 covers the bottom 74B and the sidewalls 74S of the first via hole 74, the bottom 70B and the sidewalls 70S of the second via hole 70, and the bottom 76B and the sidewalls 76S of the third via hole 76, but does not fill up the first via hole 74, the second via hole 70 and the third via hole 76. In some embodiments, the insulative layer 78 is substantially conformal to the bottom 74B and the sidewalls 74S of the first via hole 74, the bottom 70B and the sidewalls 70S of the second via hole 70 and the bottom 76B and the sidewalls 76S of the third via hole 76. The insulative layer 78 may be formed by atomic layer deposition (ALD) so that the insulative layer 78 has good step coverage. In some embodiments, the insulative layer 78 is formed by CVD, PVD or any other suitable operations.

As depicted in FIG. 4G, the insulative layer 78 on the bottom 74B of the first via hole 74 is etched to form a first spacer 80 exposing the first conductive layer 52, the insulative layer 78 on the bottom 70B of the second via hole 70 is etched to form a second spacer 82 exposing the second conductive layer 56, and the insulative layer 78 on the bottom 76B of the third via hole 76 is etched to form a third spacer 84 exposing the third conductive layer 60. In some embodiments, an anisotropic etching such as a dry etching is performed without a mask layer to remove the insulative layer 78 on the bottom 74B of the first via hole 74, the bottom 70B of the second via hole 70 and the bottom 76B of the third via hole 76, while the insulative layer 70 on the sidewalls 74S, the sidewalls 70S and the sidewall 76S is preserved.

As depicted in FIG. 4H-4I and in operation 240 of FIG. 3, a first contact via 86 coupled to the first conductive layer (lower electrode plate) 52 is formed in the first via hole 74, a second contact via 88 coupled to the second conductive layer (intermediate electrode plate) 56 is formed in the second via hole 70, and a third contact via 90 coupled to the third conductive layer (upper electrode plate) 60 is formed in the third via hole 76. In some embodiments, the first contact via 86, the second contact via 88 and the third contact via 90 are formed by forming a conductive layer (not shown) over the cap layer 52 and in the first via hole 74, the second via hole 70 and the third via hole 76. The conductive layer over the cap layer 52 is then removed by, for example, etching or chemical mechanical polishing (CMP). The material of the first contact via 86, the second contact via 88 and the third contact via 90 may include tungsten (W), copper (Cu), aluminum (Al), or any other suitable conductive materials. Accordingly, a semiconductor device 2 having a triple-layered stacked capacitor 2A is accomplished.

The first contact via 86 is extended through the cap layer 62, the third conductive layer 60, the second dielectric layer 58, the second conductive layer 56 and the first dielectric layer 54 to electrically connect the first conductive layer (lower electrode plate) 52 through the first contact via 74. The second contact via 88 is extended through the cap layer 62, the third conductive layer 60 and the second dielectric layer 58 to electrically connect the second conductive layer (intermediate electrode plate) 56 through the second contact via 70.

The first spacer 80 is configured to isolate the first contact via 86 from the third conductive layer 60 and the second conductive layer 56. The perimeter of first contact via 86 is surrounded by the cap layer 62, the third conductive layer 60, the second dielectric layer 58, the second conductive layer 56 and the first dielectric layer 54. The second spacer 82 is configured to isolate the second contact via 88 from the third conductive layer 60. The perimeter of second contact via 88 is surrounded by the cap layer 62, the third conductive layer 60 and the second dielectric layer 58. In such a case, the area of the third conductive layer (upper electrode plate) 60 can be substantially identical to the area of the second conductive layer (intermediate electrode plate) 56, and the area of the second conductive layer (intermediate electrode plate) 56 can be substantially identical to the area of the first conductive layer (lower electrode plate) 52. Accordingly, only the areas of the first contact via 86 and the second contact via 88 are sacrificed, and the thus the capacitance density can be enhanced.

The number of stacked electrode plates of the stacked capacitor is not limited to be two or three layers, and may be modified to more than three layers based on different requirement of capacitance.

Figure 5:
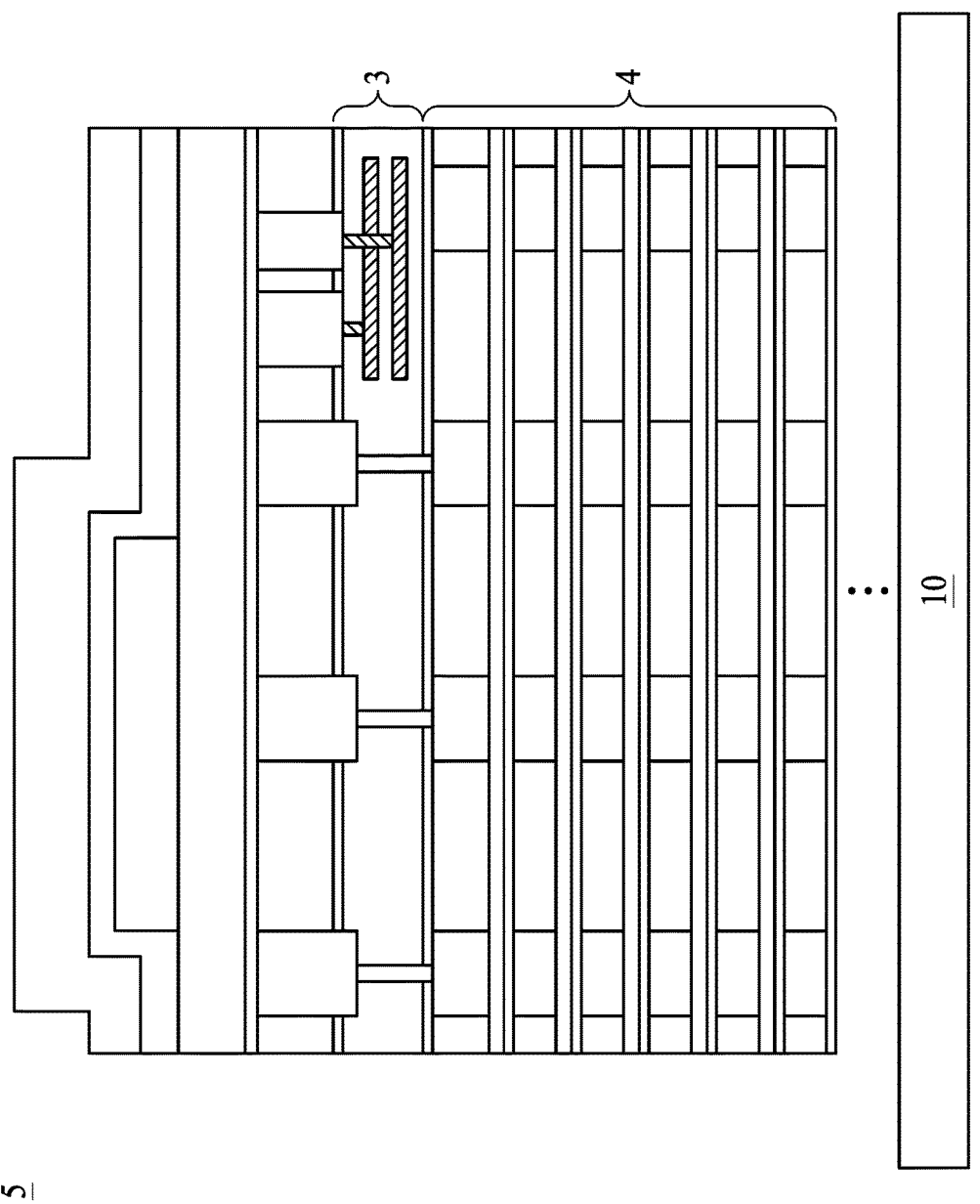
FIG. 5 is a schematic diagram of a semiconductor device according to some embodiments of the present disclosure.

FIG. 5 is a schematic diagram of a semiconductor device according to some embodiments of the present disclosure. In some embodiments, the semiconductor device 5 includes the stacked capacitor 3 formed over an interconnection layer 4. The stacked capacitor 3 may be a dual-layered stacked capacitor, a triple-layered stacked capacitor or a stacked capacitor with more than three stacked layers of electrode plates. In some other embodiments, the stacked capacitor 3 may be integrated with the interconnection layer 4. For example, part of or all of the stacked electrode plates may be formed along with the metallization layer(s) of the interconnection layer 4. In some other embodiments, the fabrication of the stacked capacitor may be integrated into back end of line (BEOL), front end of line (FOEL) or any stages of semiconductor fabrication.

In some embodiments of the present disclosure, the stacked capacitor includes a plurality of contact vias electrically connected to the respective electrode plates. The contact via electrically connected to a lower plate is extended through an upper plate through a via hole. Compared with the area of the electrode plate, the area of the contact via is extremely minute. Accordingly, the area of the upper plate is substantially identical to the area of the lower plate. Consequently, the capacitance density of the stacked capacitor is enhanced.

In some embodiments of the present disclosure, the method of manufacturing the semiconductor device requires two patterning operations to form three via holes, and thus the manufacturing cost and process complexity are reduced.

In one exemplary aspect, a semiconductor device is provided. The semiconductor device includes a semiconductor substrate, a first conductive layer, a second conductive layer, a dielectric layer, a cap layer, a first contact via and a second contact via. The first conductive layer is over the semiconductor substrate. The second conductive layer is over the first conductive layer. The dielectric layer is between the first conductive layer and the second conductive layer. The cap layer is over the second conductive layer. The first contact via is through the cap layer, the second conductive layer and the dielectric layer, and electrically connected to the first conductive layer. A bottom of the first contact via stops at an upper surface of the first conductive layer. The second contact via is through the cap layer, and electrically connected to the second conductive layer. A bottom of the second contact via stops at an upper surface of the second conductive layer.

In another exemplary aspect, a semiconductor device is provided. The semiconductor device includes a semiconductor device, a stacked structure and a plurality of contact vias. The stacked structure includes a plurality of conductive layers, and two adjacent conductive layers are isolated from each other with at least one dielectric layer. The contact vias have different heights, and are partially through the stacked structure. Each of the plurality of contact vias is electrically connected to a corresponding conductive layer of the plurality of conductive layers.

In yet another aspect, a semiconductor device is provided. The semiconductor device includes a semiconductor device, a first conductive layer, a second conductive layer, a dielectric layer, a cap layer, a first contact via, a second contact via, and a spacer. The first conductive layer is over the semiconductor substrate. The second conductive layer is over the first conductive layer. The dielectric layer is between the first conductive layer and the second conductive layer. The cap layer is over the second conductive layer. The first contact via is through the cap layer, the second conductive layer and the dielectric layer, and electrically connected to the first conductive layer. The second contact via is through the cap layer, and electrically connected to the second conductive layer. The spacer covers sidewalls of the second contact via, and the first contact via is isolated from the second conductive layer by the spacer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a semiconductor substrate;
    a first conductive layer over the semiconductor substrate;
    a second conductive layer over the first conductive layer;
    a dielectric layer between the first conductive layer and the second conductive layer;
    a cap layer over the second conductive layer;
    a first contact via through the cap layer, the second conductive layer and the dielectric layer, and electrically connected to the first conductive layer, wherein a bottom of the first contact via stops at an upper surface of the first conductive layer; and
    a second contact via through the cap layer, and electrically connected to the second conductive layer, wherein a bottom of the second contact via stops at an upper surface of the second conductive layer.

2. The semiconductor device of claim 1, further comprising:
    a first spacer covering sidewalls of the first contact via and exposing the first conductive layer; and
    a second spacer covering sidewalls of the second contact via and exposing the second conductive layer.

3. The semiconductor device of claim 2, wherein the first contact via is isolated from the second conductive layer by the first spacer.

4. The semiconductor device of claim 3, wherein the first contact via is surrounded by the cap layer, the second conductive layer and the dielectric layer.

5. The semiconductor device of claim 1, wherein an area of the second conductive layer is substantially identical to an area of the first conductive layer.

6. The semiconductor device of claim 1, further comprising an interconnection layer between the semiconductor substrate and the first conductive layer.

7. The semiconductor device of claim 1, wherein the cap layer comprises an undoped silicon glass (USG) layer.

8. A semiconductor device, comprising:
    a semiconductor substrate;
    a stacked structure comprising a plurality of conductive layers, and two adjacent conductive layers are isolated from each other with at least one dielectric layer; and
    a plurality of contact vias having different heights, and partially through the stacked structure, wherein each of the plurality of contact vias is electrically connected to a corresponding conductive layer of the plurality of conductive layers.

9. The semiconductor device of claim 8, further comprising a plurality of spacers covering sidewalls of the plurality of contact vias, respectively.

10. The semiconductor device of claim 9, wherein each of the plurality of contact vias is isolated from other conductive layers of the plurality of conductive layers by a corresponding spacer of the plurality of spacers.

11. The semiconductor device of claim 8, wherein bottoms of the plurality of contact vias are disposed at different levels.

12. The semiconductor device of claim 8, wherein tops of the plurality of contact vias are disposed at the same level.

13. The semiconductor device of claim 8, wherein the stacked structure comprises a stacked capacitor.

14. The semiconductor device of claim 8, further comprising an interconnection layer between the semiconductor substrate and the stacked structure.

15. The semiconductor device of claim 8, further comprising a cap layer over the stacked structure, wherein the cap layer surrounds sidewalls of a corresponding contact vias of the plurality of conductive vias.

16. A semiconductor device, comprising:
    a semiconductor substrate;
    a first conductive layer over the semiconductor substrate;
    a second conductive layer over the first conductive layer;
    a dielectric layer between the first conductive layer and the second conductive layer;
    a cap layer over the second conductive layer;
    a first contact via through the cap layer, the second conductive layer and the dielectric layer, and electrically connected to the first conductive layer;
    a second contact via through the cap layer, and electrically connected to the second conductive layer; and
    a spacer covering sidewalls of the second contact via, wherein the first contact via is isolated from the second conductive layer by the spacer.

17. The semiconductor device of claim 16, wherein a height of the first contact via is larger than a height of the second contact via.

18. The semiconductor device of claim 16, wherein a bottom of the first contact via is disposed on an upper surface of the first conductive layer.

19. The semiconductor device of claim 16, wherein a bottom of the second contact via is disposed on an upper surface of the second conductive layer.

20. The semiconductor device of claim 16, wherein an area of the second conductive layer is substantially identical to an area of the first conductive layer.

\* \* \* \* \*